United States Patent
Rofougaran et al.

(10) Patent No.: US 8,063,712 B2
(45) Date of Patent: Nov. 22, 2011

(54) METHOD AND SYSTEM FOR VOLTAGE CONTROLLED OSCILLATOR IMPEDANCE CONTROL TO OPTIMIZE PERFORMANCE, EFFICIENCY, AND POWER CONSUMPTION

(75) Inventors: Ahmadreza Rofougaran, Newport Coast, CA (US); Maryam Rofougaran, Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 56 days.

(21) Appl. No.: 12/397,060

(22) Filed: Mar. 3, 2009

(65) Prior Publication Data

US 2010/0225408 A1 Sep. 9, 2010

(51) Int. Cl.
*G01D 5/20* (2006.01)
*H03B 5/12* (2006.01)

(52) U.S. Cl. ............... 331/181; 331/36 C; 331/36 L; 331/117 FE; 333/214; 455/73; 455/553.1

(58) Field of Classification Search ........... 331/36 C, 331/36 L, 117 FE, 117 R, 167, 181; 333/214; 455/73, 553.1
See application file for complete search history.

(56) References Cited

U.S. PATENT DOCUMENTS

| | | | |
|---|---|---|---|
| 6,226,506 B1 * | 5/2001 | Welland et al. | 455/260 |
| 6,714,086 B1 * | 3/2004 | Landrith et al. | 331/56 |
| 6,861,913 B1 * | 3/2005 | Herzel et al. | 331/117 R |
| 6,930,569 B2 * | 8/2005 | Hsu | 333/186 |
| 6,954,111 B2 * | 10/2005 | Muramatsu et al. | 331/117 FE |
| 7,202,754 B2 * | 4/2007 | Komurasaki et al. | 331/181 |
| 7,248,838 B2 * | 7/2007 | Goodnow et al. | 455/70 |
| 7,405,632 B2 * | 7/2008 | Kishino | 331/175 |
| 2006/0181362 A1 * | 8/2006 | Ikuta et al. | 331/167 |

* cited by examiner

*Primary Examiner* — Levi Gannon
(74) *Attorney, Agent, or Firm* — McAndrews, Held & Malloy, Ltd.

(57) ABSTRACT

Methods and systems for VCO impedance control to optimize performance, efficiency, and power consumption are disclosed and may include selectively coupling one of a plurality of taps on a multi-tap inductive load to a voltage controlled oscillator (VCO) on a chip comprising a plurality of transmitters and receivers. The multi-tap inductive load may comprise a multi-tap transformer or transmission line, which may be integrated on the chip, or may be integrated on a package to which the chip is coupled. A voltage swing at an output of the VCO and/or a current in the VCO may be adjusted by configuring a load of the VCO utilizing the multi-tap inductive load. The multi-tap inductive load may be coupled to the VCO utilizing one or more CMOS switches.

12 Claims, 6 Drawing Sheets

METHOD AND SYSTEM FOR VOLTAGE CONTROLLED OSCILLATOR IMPEDANCE CONTROL TO OPTIMIZE PERFORMANCE, EFFICIENCY, AND POWER CONSUMPTION

CROSS-REFERENCE TO RELATED APPLICATIONS/INCORPORATION BY REFERENCE

This application makes reference to:
U.S. patent application Ser. No. 12/367,892 filed on Feb. 9, 2009;
U.S. patent application Ser. No. 12/396,935 filed on Mar. 3, 2009;
U.S. patent application Ser. No. 12/396,964 filed on Mar. 3, 2009;
U.S. patent application Ser. No. 12/397,005 filed on Mar. 3, 2009;
U.S. patent application Ser. No. 12/397,024 filed on Mar. 3, 2009;
U.S. patent application Ser. No. 12/397,040 filed on Mar. 3, 2009; and
U.S. patent application Ser. No. 12/397,096 filed on Mar. 3, 2009.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for voltage controlled oscillator (VCO) impedance control to optimize performance, efficiency, and power consumption.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for voltage controlled oscillator (VCO) impedance control to optimize performance, efficiency, and power consumption, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for voltage controlled oscillator (VCO) impedance control to optimize performance, efficiency, and power consumption. Exemplary aspects of the invention may comprise selectively coupling one of a plurality of taps on a multi-tap inductive load to a VCO on a chip comprising a plurality of transmitters and receivers. The multi-tap inductive load may comprise a multi-tap transformer or transmission line, which may be integrated on the chip, or may be integrated on a package to which the chip is coupled. A voltage swing at an output of the VCO and/or a current in the VCO may be adjusted by configuring a load of the VCO utilizing the multi-tap inductive load. The multi-tap inductive load may be coupled to the VCO utilizing one or more CMOS switches.

Figure 1:
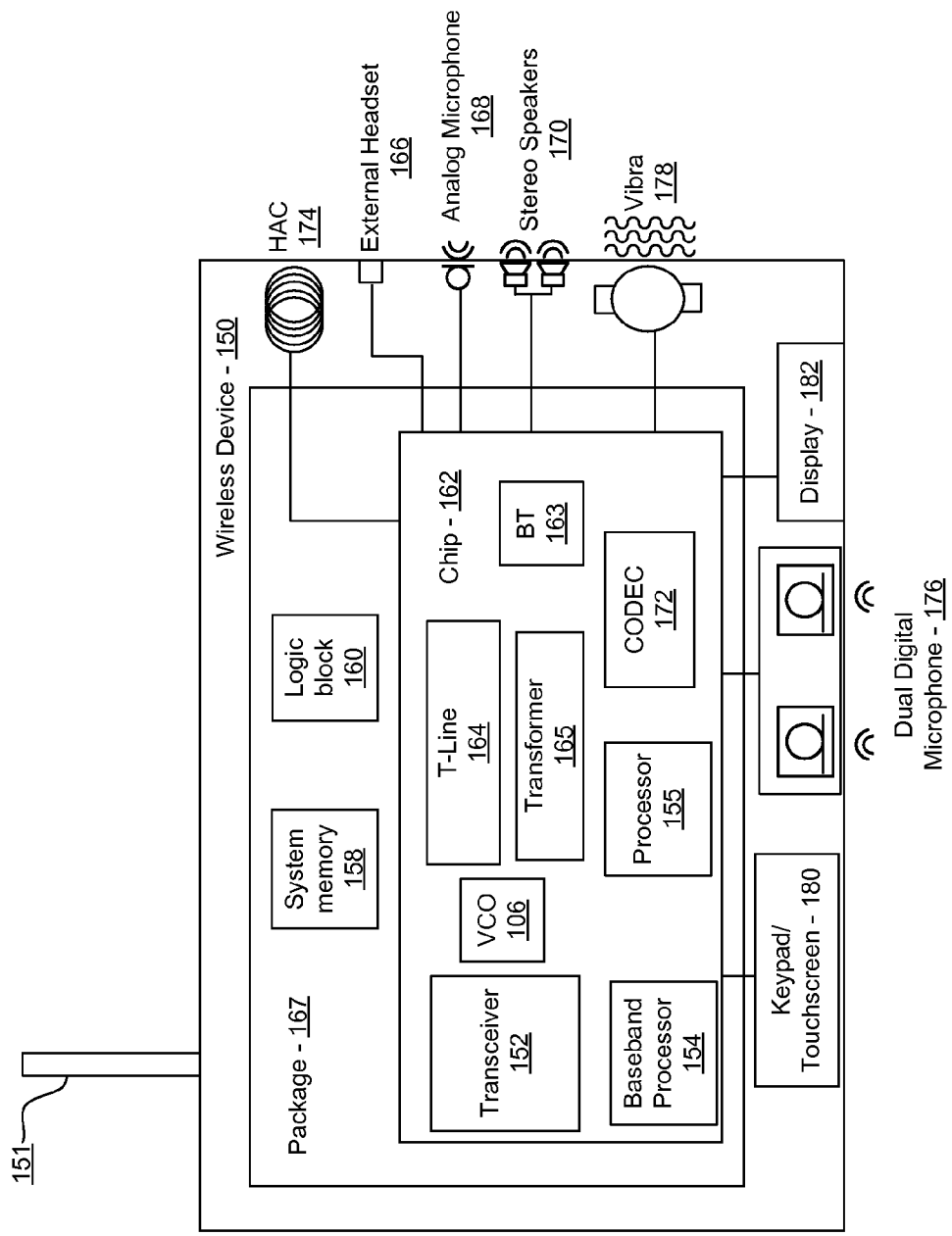
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless device 150 may comprise an antenna 151, a voltage controlled oscillator (VCO) 106, a transceiver 152, a baseband processor 154, a processor 155, a system memory 158, a logic block 160, a chip 162, a transmission line (T-Line) 164, a multi-tap transformer 165, an external headset port 166, and a package 167. The wireless device 150 may also comprise an analog microphone 168, integrated hands-free (IHF) stereo speakers 170, a hearing aid compatible (HAC) coil 174, a dual digital microphone 176, a vibration transducer 178, a keypad and/or touchscreen 180, and a display 182.

The transceiver 152 may comprise suitable logic, circuitry, interfaces, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, LTE, 3GPP, UMTS, BLUETOOTH, and ZIGBEE, for example.

The VCO 106 may comprise suitable circuitry, logic, interfaces, and/or code that may be operable to generate an output signal at a frequency determined by a received input signal voltage. The VCO 106 may be utilized by a phase locked loop (PLL) in the transceiver 152 for locking onto received RF signals, for example.

The baseband processor 154 may comprise suitable logic, circuitry, interfaces, and/or code that may be enabled to process baseband signals for transmission via the transceiver 152 and/or the baseband signals received from the transceiver 152. The processor 155 may be any suitable processor or controller such as a CPU, DSP, ARM, or any type of integrated circuit processor. The processor 155 may comprise suitable logic, circuitry, and/or code that may be enabled to control the operations of the transceiver 152 and/or the baseband processor 154. For example, the processor 155 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 155. Similarly, the processor 155 may be enabled to transfer control and/or data information, which may include the programmable parameters, to other portions of the wireless device 150, not shown in FIG. 1, which may be part of the wireless device 150.

The processor 155 may utilize the received control and/or data information, which may comprise the programmable parameters, to determine an operating mode of the transceiver 152. For example, the processor 155 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 155, for example. The information stored in system memory 158 may be transferred to the transceiver 152 from the system memory 158 via the processor 155.

The system memory 158 may comprise suitable logic, circuitry, interfaces, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 155.

The logic block 160 may comprise suitable logic, circuitry, interfaces, and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 155. Amplifier gains and/or filtering characteristics, for example, may be controlled by the logic block 160.

The BT radio/processor 163 may comprise suitable circuitry, logic, interfaces, and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 155, based on information from the processed BT signals. The BT radio/processor 163 may communicate information and/or data from the processed BT signals to the processor 155 and/or to the system memory 158. Moreover, the BT radio/processor 163 may receive information from the processor 155 and/or the system memory 158, which may be processed and transmitted via the wireless communication medium a Bluetooth headset, for example.

The CODEC 172 may comprise suitable circuitry, logic, interfaces, and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The CODEC 172 may utilize a programmable infinite impulse response (IIR) filter and/or a programmable finite impulse response (FIR) filter for at least a portion of the audio sources to compensate for passband amplitude and phase fluctuation for different output devices. In this regard, filter coefficients may be configured or programmed dynamically based on current operations. Moreover, the filter coefficients may be switched in one-shot or may be switched sequentially, for example. The CODEC 172 may also utilize a modulator, such as a Delta-Sigma ($\Delta$-$\Sigma$) modulator, for example, to code digital output signals for analog processing.

The chip 162 may comprise an integrated circuit with multiple functional blocks integrated within, such as the transceiver 152, the processor 155, the baseband processor 154, the BT radio/processor 163, the multi-tap transformer 165, the CODEC 172, and the T-Line 164. The number of functional blocks integrated in the chip 162 is not limited to the number shown in FIG. 1. Accordingly, any number of blocks may be integrated on the chip 162 depending on chip space and wireless device 150 requirements, for example.

The multi-tap transformer 165 may comprise a plurality of taps, each comprising a different number of windings such that each of the taps exhibits a different characteristic impedance, or inductance, for example. In this manner, a desired inductance may be configured for the VCO 106 for different desired performance, such as saturation level and/or current required, for example.

The T-Line 164 may comprise conductive material deposited on and/or in the chip 162, and may also comprise a plurality of taps to enable configurable impedances, such as inductances, that may be coupled to the VCO 106. In this manner, a desired inductance may be configured for the VCO 106 for different desired performance, such as saturation level and/or current required, for example. In an embodiment of the invention, the T-Line 164 conductive material may comprise metal and/or ferromagnetic material, for example.

The external headset port 166 may comprise a physical connection for an external headset to be communicatively coupled to the wireless device 150. The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The package 167 may comprise a printed circuit board or other support structure for the chip 162 and other components of the wireless device 150. The package 167 may comprise insulating and conducting material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 155. Similarly, the processor 155 may be enabled to transfer control and/or data information, which may include the programmable parameters, to other portions of the wireless device 150, not shown in FIG. 1, which may be part of the wireless device 150.

The processor 155 may utilize the received control and/or data information, which may comprise the programmable parameters, to determine an operating mode of the transceiver 152. For example, the processor 155 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 155, for example. The information stored in system memory 158 may be transferred to the transceiver 152 from the system memory 158 via the processor 155.

The CODEC 172 in the wireless device 150 may communicate with the processor 155 in order to transfer audio data and control signals. Control registers for the CODEC 172 may reside within the processor 155. The processor 155 may exchange audio signals and control information via the system memory 158. The CODEC 172 may up-convert and/or down-convert the frequencies of multiple audio sources for processing at a desired sampling rate.

The VCO 106 may be configured to operate with a maximum output voltage swing with a minimum current. This may be enabled by utilizing a variable inductance load, such as the multi-tap transformer 165 and/or the T-Line 164. The VCO 106 may generate signals at frequencies that may be utilized to down-convert RF and/or up-convert baseband signals in the transceiver 152 and may be configured to generate signals with a desired output voltage swing.

Figure 2:
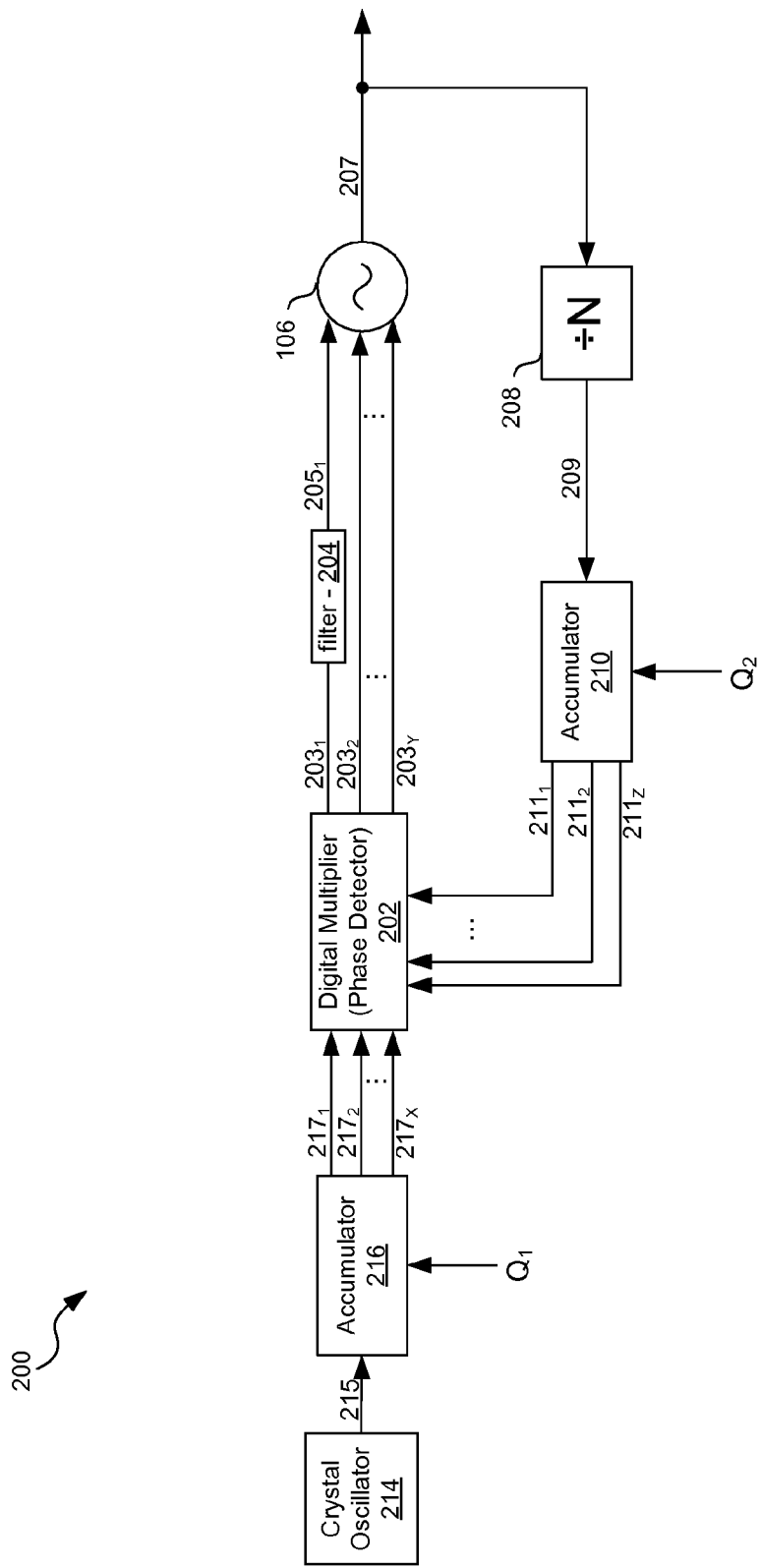
FIG. 2 is a block diagram illustrating an exemplary phased locked loop (PLL), in accordance with an embodiment of the invention.

FIG. 2 is a block diagram illustrating an exemplary phased locked loop (PLL), in accordance with an embodiment of the invention. Referring to FIG. 2 an exemplary PLL may comprise a crystal oscillator 214, an accumulator 216, a digital multiplier 202, a filter 204, the VCO 106, a frequency divider 208, and an accumulator 210.

The crystal oscillator 214 may comprise suitable logic, circuitry, interfaces, and/or code that may enable generating a stable reference frequency. The crystal oscillator 214 may be enabled to generate signals that may be utilized to clock, for example, the accumulator 216.

The accumulator 216 may comprise suitable logic, circuitry, interfaces, and/or code that may enable successively adding a control word Q1 to a value stored in the accumulator 216 on each cycle of a reference clock. The accumulator 216 may receive the control word $Q_1$ and a reference signal. In this regard, the control word $Q_1$ and the reference signal may determine a phase and/or a frequency of the output signal 217. In an exemplary embodiment of the invention, the accumulator 216 may be clocked by the crystal oscillator 214. The control word $Q_1$ may be successively added to a value stored in the accumulator 216 on each cycle of the signal 215. In this manner, the sum resulting from the addition of $Q_1$ to the value stored in the accumulator 216 may eventually be greater than the maximum value the accumulator may store, and the value in the accumulator 216 may overflow or "wrap". Accordingly, an n-bit accumulator may overflow at a frequency $f_o$ given by EQ. 1.

$$f_{216} = f_{215}(Q_1/2^n) \qquad \text{EQ. 1}$$

In this manner, the output of the accumulator 216 may be periodic with period $1/f_{216}$. Additionally, the control word, $Q_1$, may be provided by, for example, the processor 155 of FIG. 1. In this regard, possible values of the control word may be generated based on possible values of the reference frequency 215 and the desired frequency of the signal 207. Values of the control word $Q_2$ may be stored in, for example, a look up table in the system memory 158 of FIG. 1.

The digital multiplier 202 may comprise suitable logic, circuitry, and/or code that may be operable to multiply the digital signals 211 and 217 and outputting the product via $203_1, \ldots, 203_y$. An average value of the product of the signals 211 and 217 may be utilized to determine a phase difference between the signals 211 and 217. In this regard, an average product of zero may indicate the signals 211 and 217 are in-phase, while a non-zero average product may indicate a phase difference between the signals 211 and 217. Accordingly, in instances where the average product of the signals 211 and 217 is not zero, then the signal 203 may be adjusted and when the average product is zero, then the signal 203 may stabilize. However, due to the resolution of the digital multiplier 202, an exact phase lock may lie in between two successive values of the control word 203 which may result in the LSB $203_1$ toggling between high and low. Thus, controlling the VCO 106 with $203_1$ may result in jitter on the output signal 207.

The filter 204 may comprise suitable logic, circuitry and/or code that may be operable to filter the least significant bit $203_1$ output by the multiplier 202. In an exemplary embodiment of the invention, the signal $205_1$ output by the filter 204 may correspond to an average value of the signal $203_1$. In this manner, jitter and/or noise in the signal $203_1$, and thus in the output signal 207, may be reduced. For example, the filter 204 may integrate the signal $203_1$ and the signal $205_1$ may be a voltage which may correspond to an average voltage of the signal $203_1$.

The VCO 106 may comprise suitable logic, circuitry, and/or code that may be operable to generate a signal 207 based on signals 203 and 205. In this regard, the frequency of the signal 207 may be determined, at least in part, by the digital control word 203 and analog signal 205. In an exemplary embodiment of the invention, the digital signal 203 may enable a quick and/or course frequency control and the analog signal 205 may enable a fine frequency control.

The frequency divider 208 may comprise suitable logic, circuitry, and/or code for receiving a first, higher frequency and outputting a second, lower frequency. The scaling factor, N, may be determined based on one or more control signals from, for example, the processor 155 of FIG. 1. In this regard, values for the frequency divider 208 may be stored in, for example, a look-up table in the system memory 158 of FIG. 1.

The accumulator 210 may comprise suitable logic, circuitry, interfaces, and/or code that may enable successively adding a digital control word $Q_2$ to a value stored in the accumulator 210 on each cycle of a reference clock. The accumulator 210 may receive the control word $Q_2$ and a reference signal. In this regard, the control word $Q_2$ and the reference signal may determine a phase and/or a frequency of the output signal 211. In an exemplary embodiment of the invention, the accumulator 210 may be clocked by the VCO output 207. The control word $Q_2$ may be successively added to a value stored in the accumulator 210 on each cycle of the reference clock. In this manner, the sum may eventually be greater than the maximum value the accumulator 210 may store, and the value in the accumulator may overflow or "wrap". Accordingly, an N-bit accumulator will overflow at a frequency given by EQ. 2.

$$f_{210} = f_{209}(Q_2/2^n) \qquad \text{EQ. 2}$$

In this manner, the output of the accumulator 210 may be periodic with period $1/f_{210}$. Additionally, the control word, $Q_2$, may be provided by, for example, the processor 155 of FIG. 1. In this regard, possible values of the control word may be stored in, for example, a look up table in the system memory 158 of FIG. 1.

In operation, the PLL 200 may generate a signal 207 based on the fixed frequency reference signal 215 from the crystal oscillator 214. In this regard, the accumulator 210 may enable generating, based on the signal 209 and the control word $Q_2$, a digital signal 211. The signal 211 may provide feedback such that the VCO 106 may generate a signal of varying frequency while having the stability of the fixed frequency crystal oscillator 214. In this regard, the multiplier 202 may compare the phase of the signal 217 to the phase of the signal 211 and generate an error signal 203 indicative of the phase difference between the signals 211 and 217. The error signal 203 may be a digital signal comprising one or more bits. The least significant bit $203_1$ may be filtered, integrated, or otherwise processed so as to obtain the signal $205_1$ which may correspond to the average value of the signal $203_1$. The signals $203_2, \ldots, 203_N$ and $205_1$ may control a capacitance, and thus a frequency, of the VCO 106. In this manner, the phase error between the signal 211 and the signal 217 may be maintained within determined limits. Accordingly, the output signal 207 of the VCO 106 may be any integer multiple or fractional multiple of the reference signal 215. In this regard, the signal 211 may be determined using $$f_{211} = \frac{f_{207}}{N} \cdot Q_2 \cdot \frac{1}{2^n} \qquad \text{EQ. 3}$$

where $f_{211}$ is the frequency of the signal 211, $f_{207}$ is the frequency of the signal 207, N is the divide ratio of the frequency divider 208, $Q_2$ is the value of the control word input to the accumulator 210, and 'n' is the number of bits of the accumulator 210. Accordingly, the PLL 200 may be enabled to generate a wide range of frequencies, with high resolution, without the need of a traditional fractional-N synthesizer.

In an embodiment of the invention, the VCO 106 may utilize variable inductive loading to optimize oscillator performance with maximum desired output voltage swing with minimum required current. This may enhance the performance of the wireless device 150 with reduced frequency conversion noise and power consumption.

Figure 3:
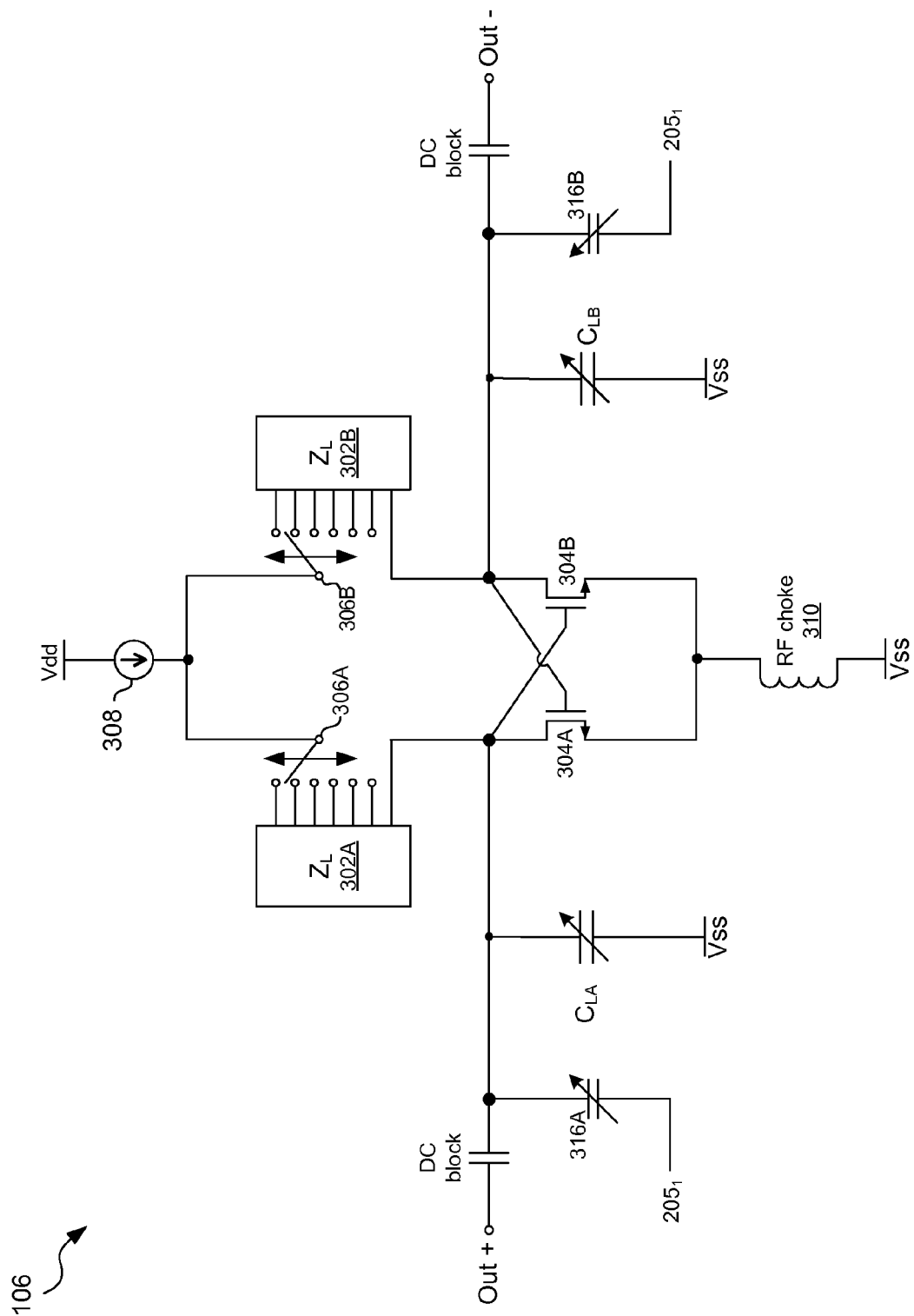
FIG. 3 is a diagram of an exemplary oscillator, in accordance with an embodiment of the invention.

FIG. 3 is a diagram of an exemplary oscillator, in accordance with an embodiment of the invention. Referring to FIG. 3 there is shown an exemplary VCO 106 which may comprise variable capacitors $C_{LA}$ and $C_{LB}$, varactors 316A and 316B, transistors 304A and 304B, and variable inductors 302A and 302B. In various embodiments of the invention, the varactors 316A and 316B may comprise diodes for which a junction capacitance is determined by a reverse bias voltage applied to the diodes.

The variable inductors 302A and 302B may comprise multi-tap transformers or multi-tap T-Lines that may enable the coupling of a range of inductance values for the inductive load of the VCO 106. One tap of the variable inductors 302A and 302B may be coupled to the drain terminals of the transistors 304A and 304B, respectively, and the other taps may be selectively coupled to the current source 308 via the switches 306A and 306B The switches 306A and 306B may comprise suitable circuitry, logic, and/or code that may be operable to couple one of a plurality of taps of the variable inductors 302A and 302B to the current source 308, thereby configuring a load impedance of the VCO 106. The switches 306A and 306B may comprise one or more CMOS switches, for example. The RF choke 310 may comprise an inductor that may be operable to filter out AC signals while allowing DC signals to pass.

In operation, the switches 306A and 306B may be operable to couple appropriate ports of the variable inductors 302A and 302B to the VCO 106. Accordingly, the inductive loading of the VCO 106 may be configured to optimize the saturation level versus current. The input voltage $205_1$ may configure the capacitance of the varactors 316A and 316B, which when changed may adjust the oscillation frequency of the VCO 106. Similarly, the variable capacitors $C_{LA}$ and $C_{LB}$, which may comprise a plurality of switchable capacitors, may enable larger adjustments of the oscillating frequency of the VCO 106, compared to the fine tuning enabled by configuring the input voltage $205_1$ to the varactors 316A and 316B.

Figure 4A:
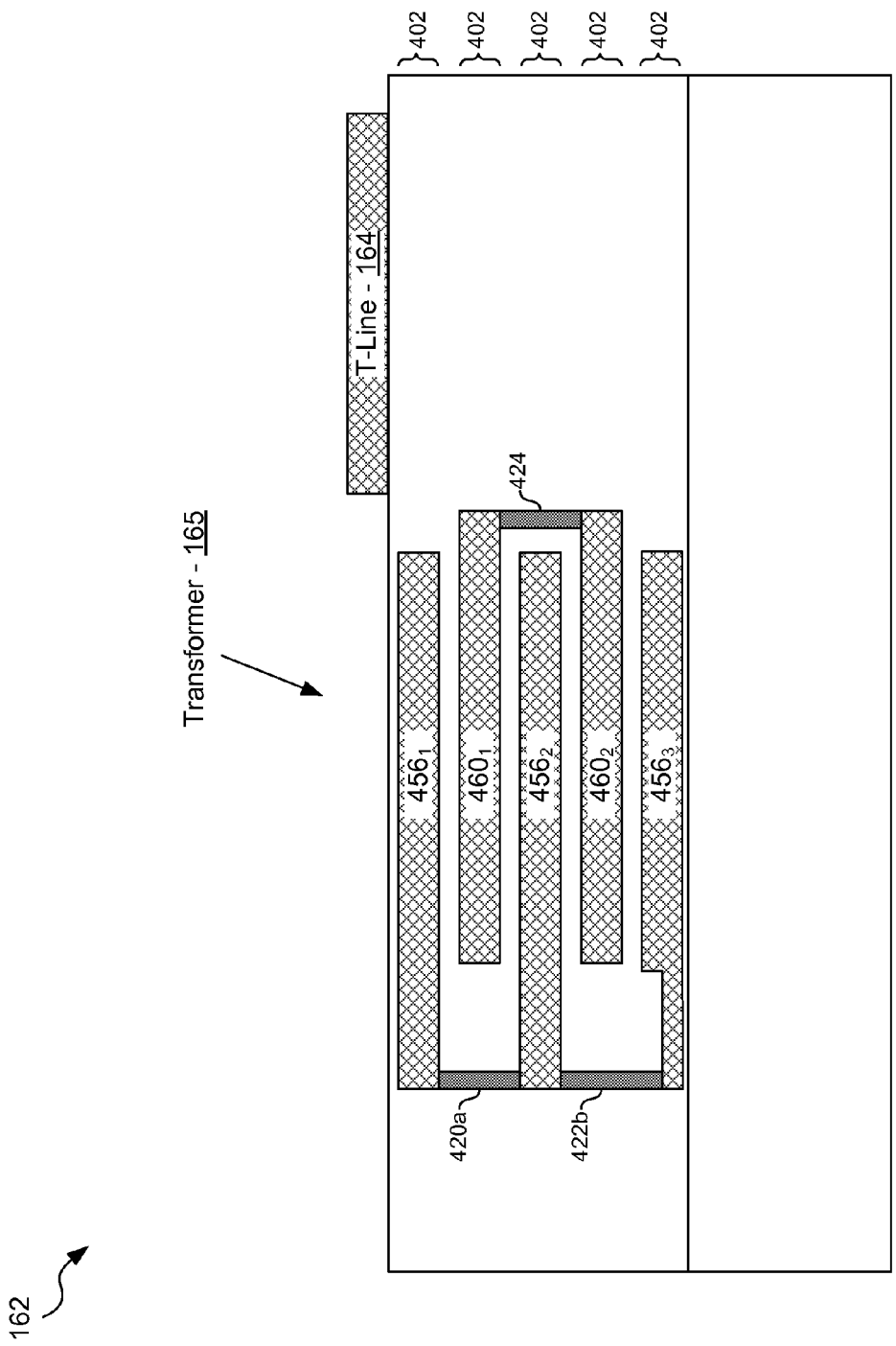
FIG. 4A is a diagram illustrating a cross sectional view of an integrated circuit comprising a transformer and a transmission line voltage-controlled oscillator load, in accordance with an embodiment of the invention.

FIG. 4A is a diagram illustrating a cross sectional view of an integrated circuit comprising a transformer and a transmission line voltage-controlled oscillator load, in accordance with an embodiment of the invention. Referring to FIG. 4, there is shown the chip 162 comprising insulating and/or semiconducting material with integrated electronics such as CMOS circuitry, the T-Line 164, metal layers 402, and vias 420a, 422b, and 424. Additionally, in various embodiments of the invention, the chip 162 may comprise one or more layers and/or areas of ferromagnetic and/or ferrimagnetic material.

The chip 162 may be substantially similar to the chip 162 described with respect to FIG. 1. Additionally, the chip 162 may be bump-bonded or flip-chip bonded to a multi-layer IC package (not shown). In this manner, wire bonds connecting the chip 162 to the multi-layer IC package may be eliminated, reducing and/or eliminating uncontrollable stray inductances due to wire bonds. In addition, the thermal conductance out of the chip 162 may be greatly improved utilizing solder balls (not shown) and thermal epoxy (not shown). The thermal epoxy may be electrically insulating but thermally conductive to allow for thermal energy to be conducted out of the chip 162 to the much larger thermal mass of a multi-layer package.

Figure 4B:
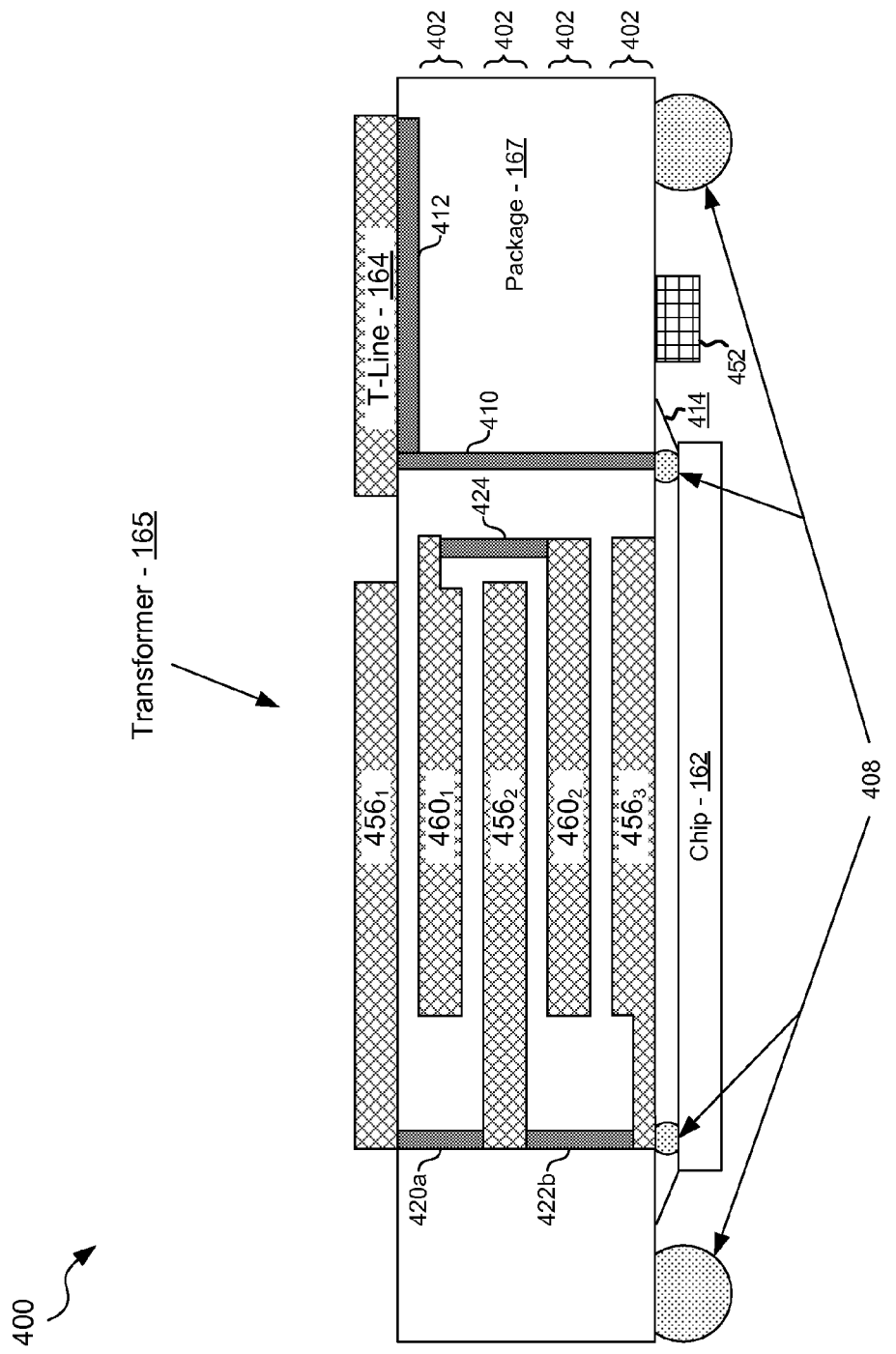
FIG. 4B is a diagram illustrating a cross sectional view of a multi-layer package with an integrated transformer and transmission line, in accordance with an embodiment of the invention.

In an exemplary embodiment of the invention, the metal layers 402, may each comprise a deposited metal layer utilized to delineate the two transformer windings 456 (comprised of loops $456_1$, $456_2$, and $456_3$) and 460 (comprised of loops $460_1$, $460_2$) also as shown in FIG. 4B. In this regard, the metal layers 402 may be deposited in shapes and/or sizes which enable varying characteristics of the multi-tap transformer 165.

In an exemplary embodiment of the invention, the vias 420a, 422b, and 424 may comprise metal and/or other conductive material(s) which may communicatively couple the metal layers 402 to one another and/or to other logic and/or circuitry in the chip 162. In this manner, signals may be conveyed to and/or from the transformer windings 456 and 460. In the exemplary embodiment of the invention depicted, vias 420a, 422b, and 424 may communicatively couple the loops $456_1$, $456_2$, and $456_3$ and loops $460_1$ and $460_2$.

The T-Line 164 may comprise conductive material deposited on and/or in the chip 162, and may also comprise a plurality of taps to enable configurable impedances, such as inductances, that may be coupled to the VCO 106. In this manner, a desired inductance may be configured for the VCO 106 for different desired performance, such as saturation level and current required, for example. In an embodiment of the invention, the T-Line 164 conductive material may comprise metal and/or ferromagnetic material, for example.

In operation, the chip 162 may transmit and/or receive RF signals. The VCO 106, described with respect to FIGS. 1-3, may be utilized to down-convert RF signals to baseband and/or to up-convert baseband signals to RF signals. The number of windings at the taps of the multi-tap transformer 165 and/or the taps of the T-Line coupled to the VCO 106 may enable configuration of the maximum voltage swing with the minimum current in the VCO 106.

In various embodiments of the invention, additional devices (e.g., transistors, capacitors, inductors, resistors) may be integrated into the chip 162 without deviating from the scope of the present invention. Additionally, although the multi-tap transformer 165 comprising five loops is depicted, various embodiments of the invention may comprise any number of metal layers, transformer loops, switching elements, etc. without deviating from the scope of the invention.

FIG. 4B is a diagram illustrating a cross sectional view of a multi-layer package with an integrated transformer and transmission line, in accordance with an embodiment of the invention. Referring to FIG. 4B, there is shown a hybrid circuit 400 comprising a package 167 and the chip 162, which may comprise a single substrate. The package 167 may comprise insulating material, metal layers 402, and the vias 410, 420a, 422b, and 424. Additionally, in various embodiments of the invention, the package 167 may comprise one or more layers and/or areas of ferromagnetic and/or ferrimagnetic material. The chip 162 may be coupled to the package 167, and the package 167 to a PCB (not shown), via solder balls 408. A surface mount component 452 may be mounted to the package 167, and thermal epoxy 414 may be pressed between the chip 162 and the package 167.

The chip 162 may be as described with respect to FIGS. 1-4A. Additionally, the chip 162 may be bump-bonded or flip-chip bonded to the package 167 utilizing solder balls (e.g. solder balls 408). In this manner, wire bonds connecting the chip 162 to the package 167 may be eliminated, reducing and/or eliminating uncontrollable stray inductances due to wire bonds. In addition, the thermal conductance out of the chip 162 may be greatly improved utilizing the solder balls 408 and the thermal epoxy 414. The thermal epoxy 414 may be electrically insulating but thermally conductive to allow for thermal energy to be conducted out of the chip 162 to the much larger thermal mass of the package 167.

The solder balls 408 may comprise spherical balls of metal to provide electrical, thermal and physical contact between the chip 162 and the package 167. In making the contact with the solder balls 408, the chip 162 may be pressed with enough force to squash the metal spheres somewhat, and may be performed at an elevated temperature to provide suitable electrical resistance and physical bond strength. The solder balls 408 may also be utilized to provide electrical, thermal and physical contact between the package 167 and a printed circuit board comprising other parts of, for example, the wireless device 150 described with respect to, for example, FIG. 1.

The surface mount device 452 may comprise discrete circuit elements such as resistors, capacitors, inductors, and diodes, for example. The surface mount device 452 may be soldered to the package 167 to provide electrical contact. In various embodiments of the invention, additional surface mount elements or no surface mount elements may be coupled to the package 167.

In an exemplary embodiment of the invention, the metal layers 402, may each comprise a deposited metal layer utilized to delineate the two transformer windings 456 (comprised of loops $456_1$, $456_2$, and $456_3$) and 460 (comprised of loops $460_1$, $460_2$) described with respect to FIG. 4A. In this regard, the metal layers 402 may be deposited in shapes and/or sizes which enable varying characteristics of the multi-tap transformer 165 and the T-Line 164. The metal layer 412 may enable the electrical connection to the plurality of taps on the T-Line 164.

In an exemplary embodiment of the invention, the vias 410, 420a, 422b, and 424 may comprise metal and/or other conductive material(s) which may communicatively couple the metal layers 402 to one another and to the solder balls 408. In this manner, signals may be conveyed to and/or from the transformer windings 456 and 460, the chip 162, and the T-Line 164. In the exemplary embodiment of the invention depicted, the vias 420a, 422b, and 424 may communicatively couple the loops $456_1$, $456_2$, $456_3$, $460_1$ and $460_2$.

In operation, the chip 162 and associated package 167 may be utilized to transmit and/or receive RF signals. The chip 162 may be electrically coupled to the T-Line 421 and the multi-tap transformer 165 embedded on and/or integrated within the package 167. In this manner, a configurable inductance may be coupled to the VCO 106 described with respect to FIGS. 1-3.

In various embodiments of the invention, additional devices, for example, capacitors, inductors, and/or resistors, may be integrated into the package 167 without deviating from the scope of the present invention. Additionally, although a transformer comprising five loops is depicted, various exemplary embodiments of the invention may comprise any number of metal layers, transformer loops, switching elements, without deviating from the scope of the invention.

Figure 5:
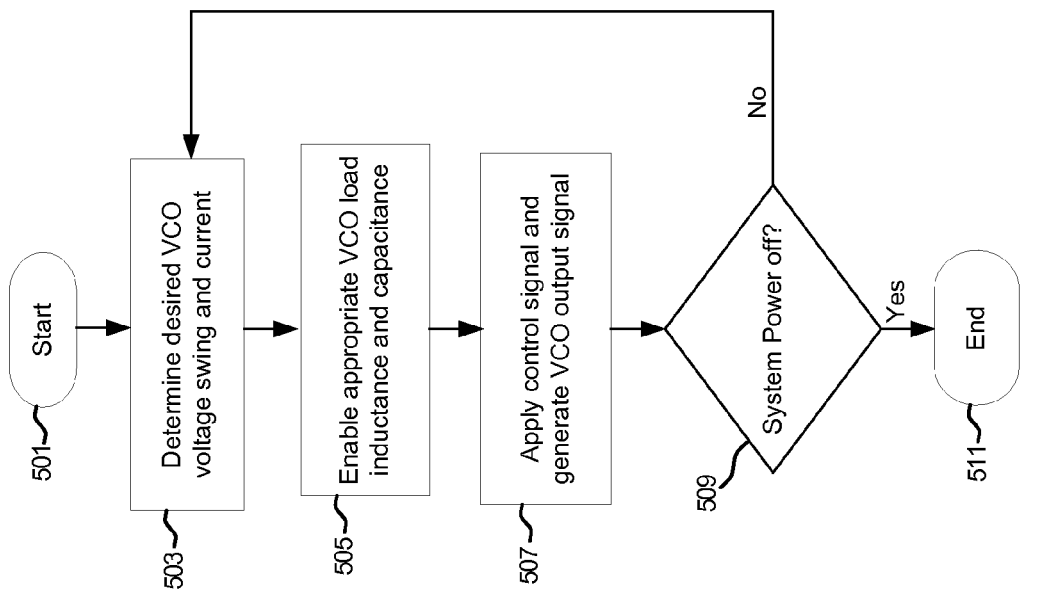
FIG. 5 is a block diagram illustrating exemplary steps for controlling a voltage controlled oscillator, in accordance with an embodiment of the invention.

FIG. 5 is a block diagram illustrating exemplary steps for controlling a voltage controlled oscillator, in accordance with an embodiment of the invention. Referring to FIG. 5, in step 503 after start step 501, the desired VCO voltage swing and current for a desired oscillating frequency may be determined. In step 505, the variable inductance load provided by a multi-tap transformer or T-Line may be coupled to the VCO 106, and the VCO load capacitances may be configured for the desired frequency range, followed by step 507, where a control voltage $205_1$ may be applied to the VCO 106 generating an output signal at the desired frequency with the desired maximum voltage swing with minimum required current. If, in step 509, the wireless device 150 is to be powered down, the exemplary steps may proceed to end step 511, but if not the exemplary steps may proceed back to step 503.

In an embodiment of the invention, a method and system are disclosed for selectively coupling one of a plurality of taps on a multi-tap inductive load to a voltage controlled oscillator (VCO) 106 on a chip 162 comprising a plurality of transmitters and receivers 152. The multi-tap inductive load 302A/302B may comprise a multi-tap transformer 165 or transmission line 164, which may be integrated on the chip 162, or may be integrated on a package 167 to which the chip 162 is coupled. A voltage swing at an output of the VCO 106 and/or a current in the VCO 106 may be adjusted by configuring a load of the VCO 106 utilizing the multi-tap inductive load 164/165. The multi-tap inductive load 164/165 may be coupled to the VCO 106 utilizing one or more CMOS switches.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for a VCO impedance control to optimize performance, efficiency, and power consumption.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for enabling wireless communication, the method comprising:
    in a chip comprising a plurality of transmitters and a plurality of receivers integrated on a single substrate,
    selectively coupling one of a plurality of taps on a multi-tap inductive load between a first supply voltage and each output of a voltage controlled oscillator (VCO) wherein:
        said selective coupling configures a saturation level of said VCO for a given current through said VCO; and
        said multi-tap inductive load comprises one of: a multi-tap transformer and a multi-tap transmission line; and
    configuring a capacitance of variable capacitors coupled between said each output of said VCO and a second supply voltage to enable communication of information by one or more of said plurality of transmitters and/or one or more of said plurality of receivers.

2. The method according to claim 1, wherein said multi-tap transformer is integrated on said chip.

3. The method according to claim 1, wherein said multi-tap transformer is integrated on a package to which said chip is coupled.

4. The method according to claim 1, comprising configuring a voltage swing at an output of said VCO by configuring a load of said VCO utilizing said multi-tap inductive load.

5. The method according to claim 1, comprising configuring a current in said VCO by configuring a load of said VCO utilizing said multi-tap inductive load.

6. The method according to claim 1, comprising selectively coupling said multi-tap inductive load to said VCO utilizing one or more CMOS switches.

7. A system for enabling communication, the system comprising:
    one or more circuits in a chip comprising a plurality of transmitters and a plurality of receivers integrated on a single substrate, wherein said one or more circuits are operable to:
    selectively couple one of a plurality of taps on a multi-tap inductive load between a first supply voltage and each output of a voltage controlled oscillator (VCO), wherein:
        said selective coupling configures a saturation level of said VCO for a given current through said VCO; and
        said multi-tap inductive load comprises one of: a multi-tap transformer and a multi-tap transmission line; and
    configure a capacitance of variable capacitors coupled between said each output of said VCO and a second supply voltage to enable communication of information by one or more of said plurality of transmitters and/or one or more of said plurality of receivers.

8. The system according to claim 7, wherein said multi-tap transformer is integrated on said chip.

9. The system according to claim 7, wherein said multi-tap transformer is integrated on a package to which said chip is coupled.

10. The system according to claim 7, wherein said one or more circuits are operable to configure a voltage swing at an output of said VCO by configuring a load of said VCO utilizing said multi-tap inductive load.

11. The system according to claim 7, wherein said one or more circuits are operable to configure a current in said VCO by configuring a load of said VCO utilizing said multi-tap inductive load.

12. The system according to claim 7, wherein said one or more circuits are operable to selectively couple said multi-tap inductive load to said VCO utilizing one or more CMOS switches.

* * * * *